US012702059B2

(12) United States Patent
Gruart et al.

(10) Patent No.: US 12,702,059 B2
(45) Date of Patent: Aug. 4, 2026

(54) METHOD FOR PRODUCING AN OPTOELECTRONIC DEVICE COMPRISING AXIAL LIGHT-EMITTING DIODES

(71) Applicants: Aledia, Echirolles (FR); Commissariat à l'Énergie Atomique et aux Énergies Alternatives, Paris (FR); Universite Grenoble Alpes, Saint Martin d'Heres (FR)

(72) Inventors: Marion Gruart, Saint-Egreve (FR); Bruno-Jules Daudin, Grenoble Cedex (FR); Walf Chikhaoui, Voiron (FR)

(73) Assignees: Aledia, Champagnier (FR); Commissariat àl'Énergie Atomique et aux Énergies Alternatives, Paris (FR); Universite Grenoble Aples, Saint Martin d'Heres (FR)

( * ) Notice: Subject to any disclaimer, the term of this patent is extended or adjusted under 35 U.S.C. 154(b) by 589 days.

(21) Appl. No.: 17/621,741

(22) PCT Filed: Jun. 25, 2020

(86) PCT No.: PCT/EP2020/067970
§ 371 (c)(1),
(2) Date: Dec. 22, 2021

(87) PCT Pub. No.: WO2020/260549
PCT Pub. Date: Dec. 30, 2020

(65) Prior Publication Data
US 2022/0238753 A1 Jul. 28, 2022

(30) Foreign Application Priority Data

Jun. 25, 2019 (FR) ...................................... 1906899

(51) Int. Cl.
*H10W 90/00* (2026.01)
*H10H 20/01* (2025.01)
(Continued)

(52) U.S. Cl.
CPC .......... *H10W 90/00* (2026.01); *H10H 20/013* (2025.01); *H10H 20/01335* (2025.01);
(Continued)

(58) Field of Classification Search
CPC ............. H01L 25/0753; H01L 33/0062; H01L 33/007; H01L 33/0075; H01L 33/06;
(Continued)

(56) References Cited

U.S. PATENT DOCUMENTS 10,304,995 B2 * 5/2019 Choi .................... H10H 20/821
10,418,595 B2 * 9/2019 Li ........................ H10H 20/823
(Continued)

FOREIGN PATENT DOCUMENTS

EP 2 290 710 A1 3/2011
WO WO 2019/002786 A1 1/2019

OTHER PUBLICATIONS

Substitutional synthesis of sub-nanometer InGaN/GaN quantum wells with high indium content Scientific repor.t (Year: 2021).*
(Continued)

*Primary Examiner* — Caleb E Henry
*Assistant Examiner* — Pratiksha Jayant Lohakare
(74) *Attorney, Agent, or Firm* — Wolf, Greenfield & Sacks, P.C.

(57) ABSTRACT

A method of manufacturing an optoelectronic device including light-emitting diodes comprising forming three-dimensional semiconductor elements, extending along parallel axes, made of a III-V compound, with a polarity of the group-III element, the method further including, for each semiconductor element, forming an active area covering the
(Continued)

semiconductor element and a stack of semiconductor layers covering the active area, the active area being formed by vapor deposition at low pressure and comprising quantum wells separated by barrier layers, each quantum well including a ternary alloy having at least one first group-III element, the group-V element, and a second group-III element, the ratio of the atomic flux of the group-III elements to the atomic flux of the group-V element is in the range from 1 to 1.8.

13 Claims, 9 Drawing Sheets

(51) Int. Cl.

| | |
|---|---|
| *H10H 20/812* | (2025.01) |
| *H10H 20/816* | (2025.01) |
| *H10H 20/819* | (2025.01) |
| *H10H 20/824* | (2025.01) |
| *H10H 20/825* | (2025.01) |

(52) U.S. Cl.
CPC ...... *H10H 20/0137* (2025.01); *H10H 20/812* (2025.01); *H10H 20/8162* (2025.01); *H10H 20/819* (2025.01); *H10H 20/824* (2025.01); *H10H 20/825* (2025.01)

(58) Field of Classification Search
CPC ....... H01L 33/145; H01L 33/20; H01L 33/30; H01L 33/32; H01L 33/08; H01L 33/14; H01L 33/24; H01L 33/18
USPC ........................................................ 438/29
See application file for complete search history.

(56) References Cited

U.S. PATENT DOCUMENTS

| | | | | |
|---|---|---|---|---|
| 2002/0172820 | A1* | 11/2002 | Majumdar | H10D 62/118 |
| | | | | 257/E21.12 |
| 2007/0248132 | A1* | 10/2007 | Kikuchi | H01L 33/007 |
| | | | | 438/150 |
| 2012/0199952 | A1* | 8/2012 | D'Evelyn | H10D 62/8503 |
| | | | | 257/E29.089 |
| 2014/0103289 | A1* | 4/2014 | Liao | H01L 21/0259 |
| | | | | 438/46 |
| 2018/0351037 | A1* | 12/2018 | Zhang | H01L 21/02387 |
| 2019/0058081 | A1* | 2/2019 | Ahmed | H10H 20/01 |
| 2019/0295992 | A1* | 9/2019 | Ahmed | H10W 90/00 |
| 2020/0043901 | A1* | 2/2020 | Ahmed | H10W 90/00 |
| 2020/0279974 | A1* | 9/2020 | Noda | H01L 27/153 |

OTHER PUBLICATIONS

International Preliminary Report on Patentability for International Application No. PCT/EP2020/067970, mailed Jan. 6, 2022.

International Search Report and Written Opinion for International Application No. PCT/EP2020/067970, mailed Sep. 17, 2020.

Preliminary Search Report for French Application No. 1906899, dated Feb. 17, 2020.

[No Author Listed] GENxplor R&D MBE System: Industry's First Fully-Integrated MBE System for the Compound Semiconductor R&D Market. Veeco. Aug. 2014:1-2.

Foxon et al., A complementary geometric model for the growth of GaN nanocolumns prepared by plasma-assisted molecular beam epitaxy. Journal of Crystal Growth. Jun. 15, 2009;311(13):3423-7.

Hamad et al., Growth of n-type InGaN nanorods on p-type silicon substrates dependent on III/V ratio. 2013 IEEE 39th Photovoltaic Specialists Conference (PVSC). Jun. 16, 2013:2425-7.

Jmerik et al., Site-Controlled Growth of GaN Nanorods with Inserted InGaN Quantum Wells on u-Cone Patterned Sapphire Substrates by Plasma-Assisted MBE. Semiconductors. May 1, 2018;52(5):667-70.

Kikuchi et al., InGaN/GaN multiple quantum disk nanocolumn light-emitting diodes grown on (111) Si substrate. Japanese Journal of Applied Physics. Nov. 5, 2004;43(12A):L1524.

Kishino et al., Monolithic integration of InGaN-based nanocolumn light-emitting diodes with different emission colors. Applied Physics Express. Dec. 21, 2012;6(1):012101.

Ra et al., Full-color single nanowire pixels for projection displays. Nano Letters. Jul. 13, 2016;16(7):4608-15.

* cited by examiner

METHOD FOR PRODUCING AN OPTOELECTRONIC DEVICE COMPRISING AXIAL LIGHT-EMITTING DIODES

This application is a national stage filing under 35 U.S.C. § 371 of International Patent Application Serial No. PCT/EP2020/067970, filed Jun. 25, 2020, which claims priority to French patent application FR19/06899, filed Jun. 25, 2019. The contents of these applications are incorporated herein by reference in their entirety.

TECHNICAL BACKGROUND

The present invention generally concerns optoelectronic devices with light-emitting diodes comprising three-dimensional semiconductor elements, for example, microwires, nanowires, micrometer- or nanometer-range conical, frusto-conical, pyramidal, or truncated pyramidal elements, and methods of manufacturing such devices.

PRIOR ART

The improvement of axial-type light-emitting diodes, comprising an active area formed at the top of each three-dimensional element, is here more particularly considered. Call active area of the light-emitting diode the region from which most of the electromagnetic radiation delivered by the light-emitting diode is emitted.

The three-dimensional elements considered herein comprise a semiconductor material mainly comprising a group-III element and a group-V element (for example, gallium nitride GaN), called III-V compound hereafter. Such devices are for example described in patent U.S. Pat. No. 9,728,680.

Each active area is sandwiched between the associated three-dimensional semiconductor element, which is generally doped with a first conductivity type, and a semiconductor layer of the same III-V compound as the semiconductor element and doped with the opposite conductivity type.

The active area may comprise multiple quantum wells, comprising an alternation of quantum wells and of barrier layers. Each quantum well may correspond to a layer of a semiconductor material having a bandgap energy smaller than that of the three-dimensional semiconductor element and of the semiconductor layer. Each quantum well may comprise a ternary alloy comprising a first group-III element, which generally corresponds to the group-III element of the III-V compound, the group-V element of the III-V compound, and at least one second group-III element, and each barrier layer may comprise the III-V compound. The central wavelength of the radiation emitted by the active area depends on the proportion of the second group-III element in the quantum well. It is desirable for the light intensity emitted at the central wavelength of the radiation emitted by the active area to be as high as possible.

SUMMARY

Thus, an object of an embodiment is to at least partly overcome the disadvantages of the previously-described optoelectronic devices and of their manufacturing methods.

Another object of an embodiment is to improve the emission performance of the optoelectronic device with axial-type light-emitting diodes.

Thus, an embodiment provides a method of manufacturing an optoelectronic device comprising light-emitting diodes comprising forming three-dimensional semiconductor elements, extending along parallel axes, made of a III-V compound, with a polarity of the group-III element of the III-V compound, the method further comprising, for each semiconductor element, forming an active area covering the top of the semiconductor element and a stack of semiconductor layers covering the active area, the active area being formed by vapor deposition at a pressure lower than 10 mPa and comprising quantum wells separated by barrier layers, each quantum well comprising a ternary alloy comprising at least one first group-III element, the group-V element of the III-V compound, and a second group-III element, the ratio of the atomic flux of the first and second group-III elements to the atomic flux of the group-V element is in the range from 1 to 1.8.

According to an embodiment, the ratio of the atomic flux of the first and second group-III element to the atomic flux of the group-V element of the III-V compound is in the range from 1 to 1.4, preferably from 1.1 to 1.3.

According to an embodiment, each quantum well is formed at a first temperature and each barrier layer is formed at a second temperature equal to the first temperature to within 50° C., preferably to within 30° C., more preferably to within 10° C.

According to an embodiment, the quantum wells and the barrier layers are formed by molecular beam epitaxy.

According to an embodiment, the first group-III element is identical to the group-III element of the III-V compound.

According to an embodiment, the ratio of the atomic flux of the first group-III element to the atomic flux of the group-V element of the III-V compound, for the forming of the quantum wells, varies from 0.01 to 1.

According to an embodiment, the ratio of the atomic flux of the second group-III element to the atomic flux of the group-V element of the III-V compound, for the forming of the quantum wells, varies from 0.05 to 5.

According to an embodiment, the three-dimensional semiconductor elements are formed by molecular beam epitaxy.

According to an embodiment, the ratio of the atomic flux of the group-III element of the III-V compound to the atomic flux of the group-V element of the III-V compound, for the forming of the three-dimensional semiconductor elements, is in the range from 0.35 to 2.

According to an embodiment, each active area comprises a base, sides, and a top, the base resting on the three-dimensional semiconductor element, the quantum wells comprising edges exposed on the sides, said stack covering the sides and the top.

According to an embodiment, each active area has the shape of a truncated pyramid of half apical angle β having its base resting on the three-dimensional semiconductor element, angle β being greater than 0°, preferably in the range from 5° to 80°, more preferably in the range from 20° to 30°.

According to an embodiment, at least a portion of each three-dimensional semiconductor element is a microwire, a nanowire, or a micrometer- or nanometer-range frustoconical element.

According to an embodiment, the three-dimensional semiconductor elements are n-type doped.

According to an embodiment, each stack comprises a semiconductor layer made of a p-type doped III-V compound.

According to an embodiment, the active areas are the regions having most of the electromagnetic radiation supplied by the light-emitting diodes emitted therefrom.

Thus, an embodiment provides a method of manufacturing an optoelectronic device comprising light-emitting diodes comprising the forming of three-dimensional semiconductor elements, extending along parallel axes, made of a III-V compound, and each comprising a lower portion and an upper portion flared with respect to the lower portion and inscribed within a frustum having a half apical angle α. The method further comprises, for each semiconductor element, the forming of an active area covering the top of the upper portion and the forming of at least one semiconductor layer of the III-V compound covering the active area by vapor deposition at a pressure lower than 10 mPa, by using a flux of the group-III element along a first direction inclined by an angle $\theta_{III}$ and a flux of the group-V element along a second direction inclined by an angle $\theta_V$ with respect to the vertical axis, the largest of the two angles $\theta_{III}$ and $\theta_V$ being smaller than angle α.

According to an embodiment, the semiconductor layers are formed by molecular beam epitaxy.

According to an embodiment, the III/V ratio, for the forming of the semiconductor layers, is smaller than 1.4, preferably smaller than 1.3.

According to an embodiment, angle α is smaller than 0°, preferably in the range from 5° to 50°, more preferably in the range from 5° to 30°.

According to an embodiment, the upper portions of the three-dimensional semiconductor elements are formed by molecular beam epitaxy.

According to an embodiment, the III/V ratio, for the forming of the upper portions of the three-dimensional semiconductor elements, is greater than 1.1.

According to an embodiment, the lower portions of the three-dimensional semiconductor elements are formed by molecular beam epitaxy.

According to an embodiment, the III/V ratio, for the forming of the lower portions of the three-dimensional semiconductor elements, is smaller than 1.4.

According to an embodiment, the temperature during the forming of the upper portions of the three-dimensional semiconductor elements is lower by at least 50° C. than the temperature during the forming of the lower portions of the three-dimensional semiconductor elements.

According to an embodiment, the active areas are formed by molecular beam epitaxy.

According to an embodiment, the lower portions of the three-dimensional semiconductor elements are microwires, nanowires, micrometer- or nanometer-range conical elements, or micrometer- or nanometer-range frustoconical elements.

According to an embodiment, the active areas are the regions having most of the electromagnetic radiation supplied by the light-emitting diodes emitted therefrom.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DESCRIPTION OF THE EMBODIMENTS

Figure 1:
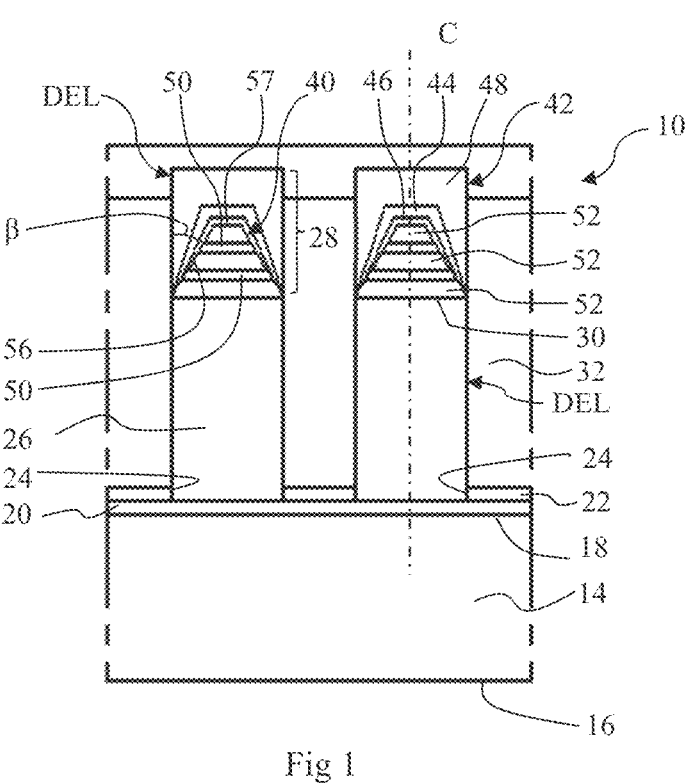
FIGS. 1 to 5 are partial simplified cross-section views of embodiments of an optoelectronic device comprising axial-type light-emitting diodes obtained according to ideal manufacturing conditions.

Like features have been designated by like references in the various figures. In particular, the structural and/or functional features that are common among the various embodiments may have the same references and may dispose identical structural, dimensional and material properties. For the sake of clarity, only the steps and elements that are useful for an understanding of the embodiments described herein have been illustrated and described in detail. In particular, the optoelectronic device control means are well known and will not be described.

In the following description, when reference is made to terms qualifying absolute positions, such as terms "front", "rear", "top", "bottom", "left", "right", etc., or relative positions, such as terms "above", "under", "upper", "lower", etc., or to terms qualifying directions, such as terms "horizontal", "vertical", etc., it is referred to the orientation of the drawings or to an optoelectronic device in a normal position of use. When a radiation exhibits a generally "bell"-shaped spectrum, having a maximum, the expression wavelength of the radiation, or central or main wavelength of the radiation, designates the wavelength at which the maximum of the spectrum is reached.

Unless specified otherwise, the expressions "around", "approximately", "substantially" and "in the order of" signify within 10%, and preferably within 5%. Further, it is here considered that the terms "insulating" and "conductive" respectively signify "electrically insulating" and "electrically conductive".

The present description concerns optoelectronic devices comprising three-dimensional semiconductor elements, for example, microwires, nanowires, micrometer- or nanometer-range conical elements, or micrometer- or nanometer-range frustoconical elements. In particular, a conical or frustoconical element may be a circular conical or circular frustoconical element or a pyramidal conical or pyramidal frustoconical element. In the following description, embodiments are described for optoelectronic devices comprising microwires or nanowires. However, such embodiments may be implemented for semiconductor elements other than microwires or nanowires, for example, conical or frustoconical elements. In the following description, it is considered that an element has a "cylindrical shape" when it corresponds to a solid delimited by a cylindrical surface and by two parallel planes, a cylindrical surface being a surface generated by a mobile straight line rotating around an axis to which it is parallel. Thereby, a prismatic shape is a specific example of cylindrical shape. In the following description, it is considered that an element has a "conical shape" when it corresponds to a cone, that is, a solid delimited by a plane and a conical surface, a conical surface being a surface generated by a straight line running through a fixed point called apex and a variable point following a closed curve, where the plane does not contain the apex and cutting the conical surface. Further, it is considered that an element has a "frustoconical" shape when it corresponds to a cone having had its upper portion, containing the apex, removed.

Call ternary alloy an alloy essentially formed of three elements (for example, two group-III elements and one group-V element) but of course this alloy may be associated with other elements (for example, group-III) and then form a more complex alloy, for example, a quaternary alloy.

The term "microwire", "nanowire", "conical element", or "frustoconical element" designates a three-dimensional structure having a shape, for example, cylindrical, conical, or frustoconical, elongated along a main direction, called axis hereafter, having at least two dimensions, called minor dimensions, in the range from 5 nm to 2.5 μm, preferably from 50 nm to 1 μm, the third dimension, called major dimension, being greater than or equal to 1 time, preferably greater than or equal to 5 times, and more preferably still greater than or equal to 10 times, the largest minor dimension, for example, in the range from 1 μm to 50 μm.

FIG. 1 is a partial simplified cross-section view of an example of an optoelectronic device 10 with axial-type light-emitting diodes. Optoelectronic device 10 comprises, from bottom to top in FIG. 1:

a substrate 14, for example, a semiconductor substrate, comprising parallel surfaces 16 and 18, preferably planar, surface 18 being treated to promote the growth of wires. This treatment is schematically shown in FIG. 1 by a seed layer 20 made of a material favoring the growth of wires, on the surface 18 of substrate 14;

an insulating layer 22 covering seed layer 20 and comprising through openings 24;

wires 26 having parallel axes C, two wires 26 being shown in FIG. 1 at least partly doped with a first conductivity type, for example, n-type doped;

for each wire 26, a head 28 covering the top 30 of wire 26;

an insulating layer 32 covering the lateral surfaces of wires 26 and partially the lateral surfaces of heads 28; and an electrode layer 34 covering insulating layer 32 and in contact with heads 28.

Optoelectronic device 10 comprises another electrode, not shown, for biasing the base of wires 26.

Each head 28 comprises, from bottom to top in FIG. 1:

an active area 40 covering the top 30 of wire 26; and a semiconductor stack 42 covering active area 40 and comprising a doped semiconductor layer 44 of a second conductivity type opposite to that of wire 26, for example, p-type doped, and covering active area 40.

The assembly formed by each wire 26 and the associated head 28 forms a light-emitting diode DEL in axial configuration.

Semiconductor stack 42 may further comprise an electron-blocking layer 46 between active area 40 and semiconductor layer 44 and a semiconductor bonding layer 48 covering semiconductor layer 44 on the side opposite to active area 40, bonding layer 48 being covered with electrode layer 34. The electron-blocking layer 46 in contact with active layer 40 and semiconductor layer 44 enables to optimize the presence of electric carriers in active area 40. Bonding layer 48 may be made of the same material as semiconductor layer 44 and doped with the same conductivity type as semiconductor layer 44 but with a higher dopant concentration to enable the forming of an ohmic contact between semiconductor layer 44 and electrode layer 34.

Active area 40 is the area of light-emitting diode DEL having most of the electromagnetic radiation delivered by light-emitting diode DEL emitted therefrom. According to an example, active area 40 comprises confinement means. Active area 40 may comprise quantum wells, each quantum well comprising a layer of a semiconductor material having a bandgap energy smaller than that of wire 26 and of semiconductor portion 44, preferably interposed between two barrier layers, where the barrier layers may be made of the same material as wire 26 and non-intentionally doped. As an example, in FIG. 1, an alternation along axis C of two quantum wells 50 and of three barrier layers 52 has been shown. Preferably, active area 40 comprises from three to fifteen quantum wells 50, preferably approximately ten quantum wells 50.

In the present embodiment, active area 40 has a pyramidal shape having inclined sides 56 and a top 57. In active area 40, the layers forming quantum wells 50 and barrier layers 52 are substantially planar. The stack 42 of layers 44, 46 and 48 covers the sides 56 and the top 57 of active area 40. Thereby layers 44 and 46 are located opposite the lateral edges of each quantum well 50. Sides 56 are inclined by an angle β with respect to the axis C of wire 26. According to an embodiment, angle β is in the range from 0° to 80°, preferably from 10° to 45°, more preferably from 20° to 30°.

An example of a method of manufacturing optoelectronic device 10 comprises growing wires 26, active areas 40, and semiconductor stacks 42 by implementing a growth method that favors a crystalline growth along axis C of wires 26. The wire growth method may be a method of chemical vapor deposition (CVD) or metal-organic vapor phase epitaxy (MOCVD) type, also known as metal-organic vapor phase epitaxy (MOVPE), or plasma-assisted MOCVD (PA-MOCVD), or a method such as molecular beam epitaxy (MBE), gas-source MBE (GSMBE), metal-organic MBE (MOMBE), plasma-assisted MBE (PA-MBE), atomic layer deposition (ALD) or hydride vapor phase epitaxy or halide vapor phase epitaxy (HYPE), may be used. However, electrochemical processes may be used, for example, chemical bath deposition (CBD), hydrothermal processes, liquid aerosol pyrolysis, or electrodeposition.

Figure 2:
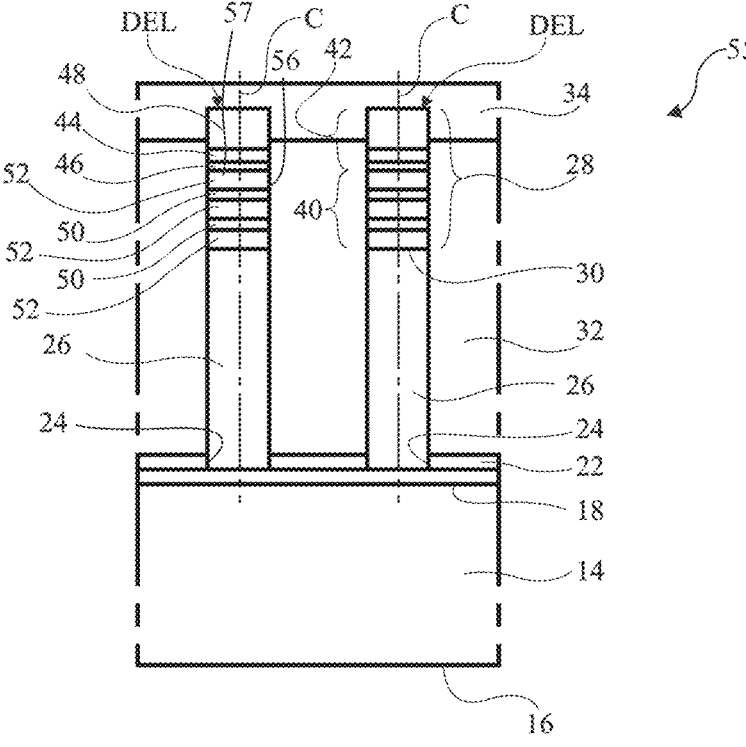

FIG. 2 is a partial simplified cross-section view of another embodiment of an optoelectronic device 55. Optoelectronic device 55 comprises all the elements of the optoelectronic device 10 shown in FIG. 1, with the difference that active area 40 has a cylindrical shape with non-inclined sides 56. The stack 42 of layers 44, 46, and 48 only covers the top 57 of active area 40.

Figures 3, 4:
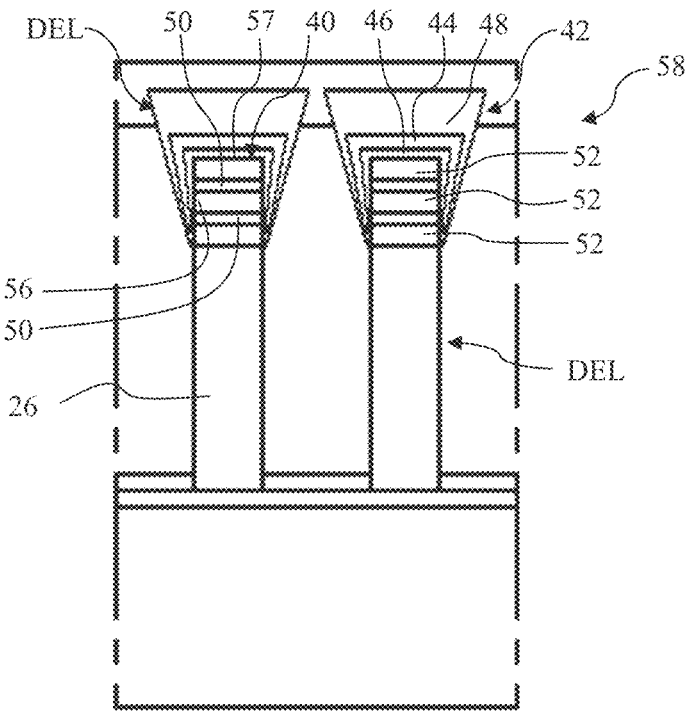

FIG. 3 is a partial simplified cross-section view of an embodiment of an optoelectronic device 58. Optoelectronic device 58 comprises all the elements of the optoelectronic device 10 shown in FIG. 1, with the difference that active area 40 has the same shape as the active area 40 of the optoelectronic device 55 shown in FIG. 2, that is, cylindrical. The stack 42 of active layers 44, 46, and 48 covers the sides 56 and the top 57 of active area 40. Thereby, layers 44, 46, and 48 are located opposite the lateral edges of each quantum well 50. An advantage of the optoelectronic device 10 shown in FIG. 1 over the optoelectronic device 58 shown in FIG. 3 is that risks of forming of passages for the current between semiconductor stack 42 and wire 26 are decreased. Further, the thickness of the portions of stack 42 at the level of the sides 56 of active area 40 may be greater for the optoelectronic device 10 shown in FIG. 1 as compared with the optoelectronic device 58 shown in FIG. 3, which enables to decrease the electric resistance of these portions.

FIG. 4 is a cross-section view of an embodiment of an optoelectronic device 60. Optoelectronic device 60 comprises all the elements of the optoelectronic device 58 shown in FIG. 3, with the difference that each wire 26 comprises a lower portion 62 having a substantially constant cross-section extending in an upper portion 64 of outward-flared shape where the cross-section area increases along axis C as the distance to substrate 14 increases. As appears in this drawing, the layers of semiconductor stack 42 do not extend in contact with wire 26 at least at the level of the top of wire 26. In the embodiment shown in FIG. 4, upper portion 64 comprises substantially planar facets inclined with respect to axis C by an angle α. Generally, call angle of upper portion 64 the half apical angle of the frustum of axis C of circular base having upper portion 64 inscribed therein. According to an embodiment, angle α is greater than 0°, preferably between 5° and 50°, more preferably between 5° and 30°.

Preferably, for each wire 26, the top 30 of the upper portion 62 of wire 26 corresponds to a substantially planar surface orthogonal to axis C of wire 26. Preferably, the surface area of top 30 is greater by at least 20% than the cross-section area of the lower portion 62 of wire 26. The height of the upper portion 64 of each wire 26 measured along axis C may be in the range from 5 nm to 2 μm, preferably from 20 nm to 500 nm. The height of the lower portion 62 of each wire 26 measured along axis C may be in the range from 200 nm to 5 μm. For each wire 26, the mean diameter of the lower portion 62 of wire 26, which is the diame ter of the disk of same surface area as the cross-section area of wire 26, may be in the range from 50 nm to 10 μm, preferably from 100 nm to 2 μm, preferably from 100 nm to 1 μm. The cross-section of the lower portion 62 of wire 26 may have different shapes, for example, oval, circular, or polygonal, in particular rectangular, square, or hexagonal.

Figure 5:
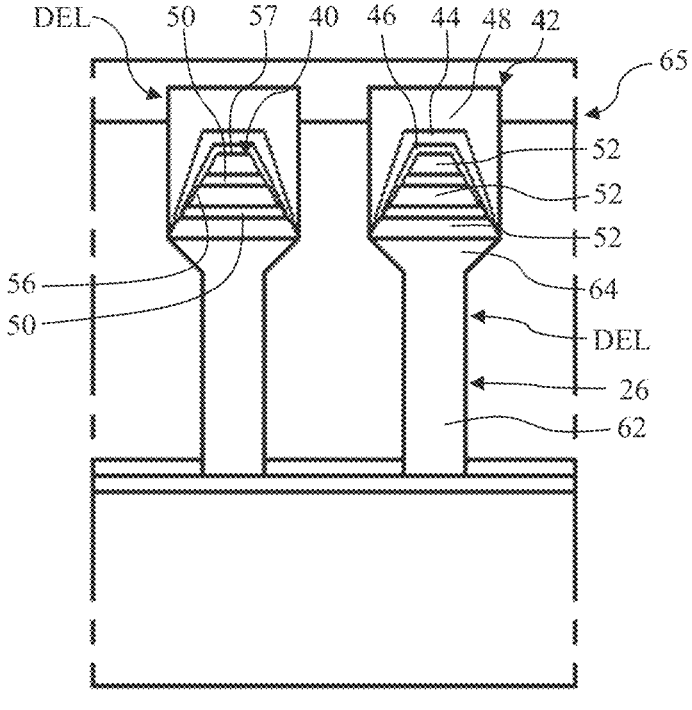

FIG. 5 is a partial simplified cross-section view of an embodiment of an optoelectronic device 65. Optoelectronic device 65 comprises all the elements of the optoelectronic device 10 shown in FIG. 1, with the difference that wire 26 has the structure of the wire 26 of the optoelectronic device 60 shown in FIG. 4.

In the embodiments previously described in relation with FIGS. 1, 3, 4, and 5, semiconductor stack 42 is directly in contact with each quantum well 50 of active area 40 since it comes in mechanical contact with the lateral edges of each quantum well 50. The injection of holes into each quantum well may thus occur through the lateral edges of the quantum well. Further, the exchange surface area between stack 42 and active area 40 is increased with respect to the exchange surface area of FIG. 2, which corresponds to a contact surface between two planes.

Wires 26, semiconductor layers 44, and bonding layers 48 may be at least partly made of semiconductor materials mainly comprising a III-V compound, for example, a III-N compound. Examples of group-III elements comprise gallium (Ga), indium (In), or aluminum (Al). Examples of III-N compounds are GaN, AN, InN, InGaN, AlGaN, or AlInGaN. Other group-V elements may also be used, for example, phosphorus or arsenic. Generally, the elements in the III-V compound may be combined with different molar fractions. The III-V compounds of the wires and of layers 44, 48 may comprise a dopant, for example, silicon, which is an n-type dopant for III-N compounds, or magnesium, which is a p-type dopant for III-N compounds.

Saying that a compound made up of at least a first element and of a second element has a polarity of the first element or a polarity of the second element means that the material grows along a preferred direction and that when the material is cut in a plane perpendicular to the preferred growth direction, the exposed surface essentially comprises atoms of the first element in the case of the polarity of the first element or atoms of the second element in the case of the polarity of the second element.

The material forming seed layer 20 is selected to favor the growth of wires 26 according to the same polarity. Preferably, the material forming seed layer 20 is preferably selected to favor the growth of the III-V compound according to the polarity of the group-III element, called metal polarity hereafter. According to the present invention, the growth conditions are defined so that when a second polar semiconductor material is grown on a first polar semiconductor material, the second semiconductor material keeps the polarity of the first semiconductor material. Thereby, the polarity of quantum wells 50 is the same as that of wires 26. The growth according to the metal polarity, for example, according to the Ga polarity, of the semiconductor material comprising the III-V compound enables, advantageously, particularly on forming of the quantum wells, to decrease the incorporation into the semiconductor material, through the free surface area of the semiconductor material, of impurities responsible for non-radiative recombinations with respect to the case where the growth of the semiconductor material is performed according to the polarity of the group-V element, for example, according to the N polarity.

The semiconductor material of the quantum well or of the quantum wells of active area 40 may comprise the III-V compound of wire 26 and of semiconductor layer 44 having at least one second group-III element incorporated into it. As an example, in the case of wires 26 made of GaN, the second group-III element is for example indium (In). The atomic percentage of the second group-III element is a function of the desired optical properties and of the emission spectrum of light-emitting diode DEL. When the upper portion 64 of wire 26 is present and is not intentionally doped, it may replace one of the barrier layers of active area 40.

Electron blocking layer 46 may be formed of a ternary alloy, for example, of aluminum gallium nitride (AlGaN) or of aluminum indium nitride (AlInN).

Substrate 14 may correspond to a monoblock structure or may correspond to a layer covering a support made of another material. Substrate 14 is preferably a semiconductor substrate, for example, a substrate made of silicon, of germanium, of silicon carbide, of a III-V compound, such as GaN or GaAs, or a conductive substrate, for example, a metal substrate, particularly made of copper, of titanium, of molybdenum, of an alloy based on nickel or steel, or a sapphire substrate. Preferably, substrate 14 is a single-crystal silicon substrate. Preferably, it is a semiconductor substrate compatible with manufacturing methods implemented in microelectronics. Substrate 14 may correspond to a multi-layer structure of silicon-on-insulator type, also called SOI.

Seed layer 20 is made of a material favoring the growth of wires 26. As an example, the material forming seed layer 20 may be a nitride, a carbide, or a boride of a transition metal from column IV, V, or VI of the periodic table of elements, or a combination of these compounds. As an example, seed layer 20 may be made of aluminum nitride (AlN). Seed layer 20 may have a monolayer structure or may correspond to a stack of two layers or of more than two layers.

Insulating layer 22 may be made of a dielectric material, for example, silicon oxide ($SiO_2$) or silicon nitride ($Si_xN_y$, where x is approximately equal to 3 and y is approximately equal to 4, for example, $Si_3N_4$). As an example, the thickness of insulating layer 22 is in the range from 5 nm to 100 nm, for example, equal to approximately 30 nm. Insulating layer 22 may have a monolayer structure or may correspond to a stack of two layers or of more than two layers.

Insulating layer 32 may be made of a dielectric material, for example, silicon oxide ($SiO_2$) or silicon nitride ($Si_xN_y$, where x is approximately equal to 3 and y is approximately equal to 4, for example, $Si_3N_4$). Insulating layer 32 may have a monolayer structure or may correspond to a stack of two layers or of more than two layers. As an example, insulating layer 32 may be made of a polymer material, of an inorganic material, or of a polymer material and of an inorganic material. As an example, the inorganic material may be titanium oxide ($TiO_2$ or aluminum oxide ($Al_xO_y$, where x is approximately equal to 2 and y is approximately equal to 3, for example, $Al_2O_3$).

Electrode layer 34 is capable of biasing the active area 40 covering each wire 26 and of giving way to the electromagnetic radiation emitted by light-emitting diodes DEL. The material forming electrode layer 34 may be a transparent and conductive material such as indium tin oxide (ITO), zinc oxide, doped or not with aluminum or gallium, or graphene. As an example, electrode layer 34 has a thickness in the range from 5 nm to 200 nm, preferably from 20 nm to 50 nm.

The inventors have shown that axial-type three-dimensional light-emitting diodes having the desired optical properties could be manufacturing when wires 26 of III-V compound have the polarity of the group-III element of the III-V compound and active areas 40 are formed by vapor deposition at a pressure lower than 1.33 mPa ($10^{-5}$ Torr), particularly by PA-MBE, with specific growth conditions of the quantum wells and of the barrier layers. To ensure an optimal growth according to the metal polarity of each semiconductor material forming the different portions of the three-dimensional light-emitting diode ensuring a good flatness at the interfaces between the quantum wells and the barrier layers, the ratio of the sum of the atomic fluxes of all the group-III elements forming the semiconductor material to the atomic flux of the group-V element forming the semiconductor material is selected to be greater than 1. This particularly enables to avoid having a pyramidal-type growth or the forming of roughnesses on the free surface of the semiconductor material.

To obtain a planar growth of the layers of active area 40 with a marked rupture of the composition between each quantum well 50 and the barrier layer 52 subsequently formed on the quantum well and in contact with the quantum well, the ratio of the sum of the atomic fluxes of all the group-III elements forming the semiconductor material to the atomic flux of the group-V element forming the semiconductor material is selected to be greater than 1, preferably between 1 and 1.8, preferably varying from 1 to 1.4, more preferably still from 1.1 to 1.3. Indeed, the reduced proportion of the residual second group-III element at the end of the forming of the quantum well enables to avoid the incorporation of this second group-III element into the subsequent barrier layer, which would degrade the obtaining of an abrupt composition transition between the quantum well and the barrier layer. This further enables to substantially keep the same temperature in the reactor on forming of the quantum wells and of barrier layers and thus to avoid phases of temperature change between the forming of a quantum well and of a barrier layer, in particular of temperature rise for the forming of a barrier layer after the removal, for example, by vacuum evaporation of the second residual group-III element at the end of the forming of a quantum well.

Further, in the embodiments previously described in relation with FIGS. 1, 3, 4, and 5, where semiconductor stack 42 is directly in contact with each quantum well 50 of active area 40, a better injection of holes into well-delimited quantum wells 50 is thus obtained.

FIGS. 6A to 6D are partial simplified cross-section views of the structure obtained at successive steps of an embodiment of a method of manufacturing the optoelectronic device 60 shown in FIG. 4.

Figure 6A:
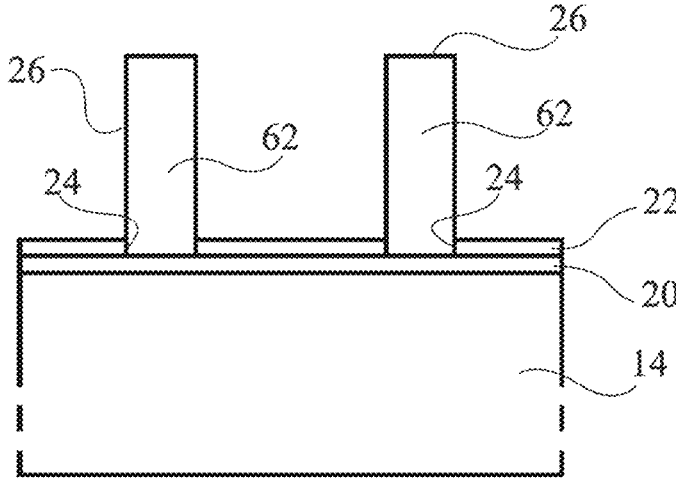
FIGS. 6A to 6D are partial simplified cross-section views of structures obtained at successive steps of another embodiment of a method of manufacturing the optoelectronic device shown in FIG. 4.

FIG. 6A shows the structure obtained after the steps of:

forming on substrate 14 of seed layer 20;

forming of insulating layer 22 on seed layer 20;

forming of openings 24 in insulating layer 22 to expose portions of seed layer 20 at the desired locations of wires 26, the diameter of openings 24 substantially corresponding to the mean diameter of the lower portions 62 of wires 26; and growth of the lower portions 62 of wires 26 from seed layer 20 in openings 24.

Seed layer 20 and insulating layer 22 may be formed by CVD, physical vapor deposition (PVD), or ALD.

According to an embodiment, the growth of the lower portions 62 of wires 26 is achieved by PA-MBE. The pressure in the reactor is in the range from $10^{-4}$ Torr (13.3 mPa) to $10^{-7}$ Torr (0.0133 mPa). The growth conditions in the reactor are adapted to favoring a preferential growth of the lower portion 62 of each wire 26 along its axis C. This means that the growth speed of wire 26 along axis C is much greater, preferably by at least one order of magnitude, than the growth speed of wire 26 along a direction perpendicular to axis C. Call III/V ratio the ratio of the atomic flux of the group-III element of the III-V compound to the atomic flux of the group-V element of the III-V compound. The III/V ratio is preferably smaller than 1.4, particularly in the range from 0.3 to 1.4, more preferably in the range from 0.35 to 1, for example, equal to approximately 0.8. The temperature in the reactor is for example in the range from 600° C. to 1,000° C., preferably from 700° C. to 950° C., more preferably from 800° C. to 925° C., for example, approximately 900° C.

Figure 6B:
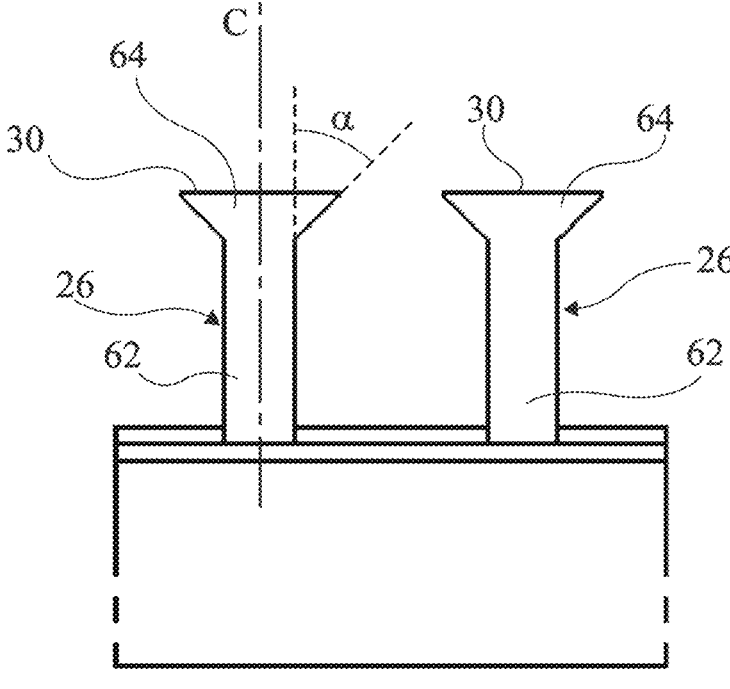

FIG. 6B shows the structure obtained after the growth of the upper portions 64 of wires 26. According to an embodiment, the growth of the upper portions 64 of wires 26 is achieved by PA-MBE. The pressure in the reactor is in the range from $10^{-4}$ to $10^{-7}$ Torr. The III/V ratio is preferably greater than 1.1, particularly in the range from 1.1 to 2, more preferably in the range from 1.3 to 1.6, for example, equal to approximately 1.4. The temperature in the reactor is lower than the temperature used for the forming of the lower portions 62 of the wires when they are formed by MBE, preferably of at least 50° C., for example, in the range from 550° C. to 950° C., preferably from 650° C. to 900° C., more preferably from 750° C. to 875° C., for example, approximately 850° C. This enables to obtain a widening of the upper portion 64 of each wire 26, preferably by at least 20%. An upper portion 64 having its lateral portion forming angle α with axis C as previously described is then obtained.

Advantageously, when the upper portions 64 of wires 26 are formed by PA-MBE, the dimensions of the surface area of the top 30 of each upper portion 64, having active area 40 formed therein, are substantially set by the III/V ratio used for the forming of upper portion 64, and are substantially independent from the mean diameter of the lower portion 62 of wire 26 having upper portion 64 extending therefrom. This thus enables to accurately control the dimensions of the surface of top 30 of upper portion 64 and thus the lateral dimensions of active area 40. This enables to at least partially compensate for the variations of the mean diameters of the lower portions 62 of wires 26 which may result from the wire manufacturing method.

Further, the wavelength of the radiation emitted by a quantum well particularly depends on the proportion of the second group-III element, for example, indium, incorporated in the ternary compound of the quantum well. This proportion itself depends on the lateral dimensions of active area 40. Thereby, an accurate control of the lateral dimensions of active area 40 enables to accurately control the wavelength of the radiations emitted by active area 40. The variations of the wavelengths of the radiation emitted by the light-emitting diodes can thus be decreased.

Figure 6C:
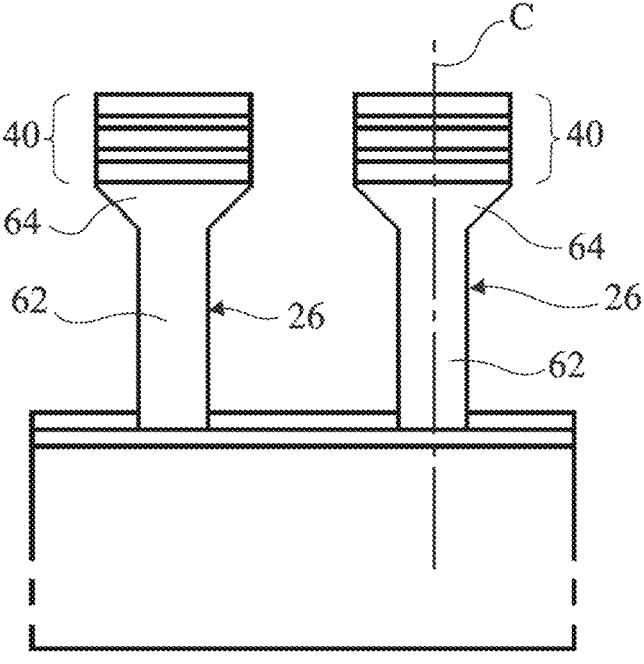

FIG. 6C shows the structure obtained after the growth of the layers of active areas 40. According to an embodiment, the growth of active areas 40 is achieved by PA-MBE. The pressure in the reactor is in the range from $10^{-4}$ to $10^{-7}$ Torr. For the forming of each quantum well, a second group-III element is added into the reactor. The ratio of the atomic fluxes of the group-III elements to the atomic flux of the group-V element is equal to the III/V flux used for the forming of the upper portions 64 of wires 26 when they are formed by MBE. The temperature in the reactor is for example in the range from 500° C. to 750° C., preferably from 600° C. to 700° C.

Figure 6D:
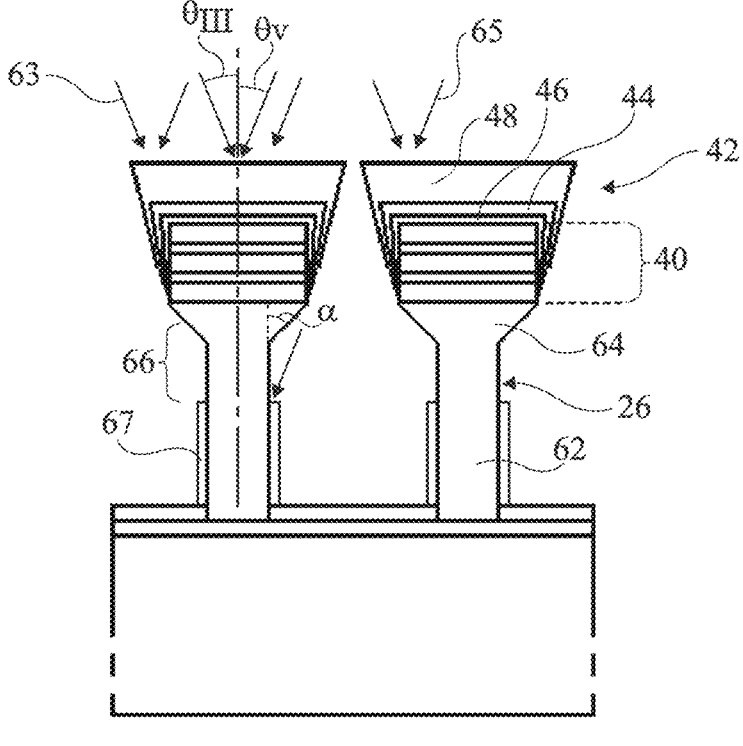
Figure 8:
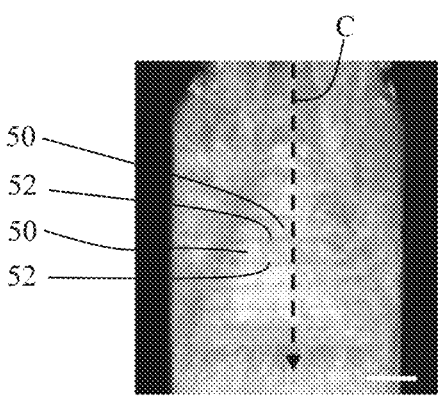
FIGS. 8 and 9 respectively are an image obtained by scanning electron microscopy and profiles of atomic percentages of elements of a portion of the device of FIG. 1 for first manufacturing conditions.

FIG. 6D shows the structure obtained after the growth of the layers of semiconductor stacks 42. According to an embodiment, the growth of the layers of semiconductor stacks 42 is achieved by PA-MBE. The structure is rotating in the reactor around a vertical axis. The pressure in the reactor is in the range from $10^{-4}$ to $10^{-7}$ Torr. For the forming of electron-blocking layer 46, a third group-III element is added into the reactor, the III/V ratio is preferably close to 1, and the ratio of the atomic flux of the third element to the atomic flux of the group-V element is in the range from 0.1 to 0.3. For the forming of electron-blocking layer 46, the temperature in the reactor is for example in the range from 600° C. to 1,000° C., preferably from 700° C. to 950° C., more preferably from 750° C. to 900° C. For the forming of semiconductor layer 44 or 48, the III/V ratio is preferably smaller than 1.3, particularly in the range from 1.1 to 1.3. For the forming of semiconductor layer 44 or 48, the temperature in the reactor is for example in the range from 700° C. to 900° C., preferably from 750° C. to 850° C. The atomic fluxes of the group-III element and of the group-V element are schematically shown in FIG. 8 by arrows 63, 65. Call $\theta_{III}$ the angle of incidence of the atomic flux of the group-III element and $\theta_V$ that of the atomic flux of the group-V element with respect to the axis C of the wires. Angles $\theta_{III}$ and $\theta_V$ particularly depend on the type of reactor used. When the largest of angles $\theta_{III}$ and $\theta_V$ is smaller than angle $\alpha$, an area 66 is obtained on the lower portion 62 of each wire 26 where there has been no deposition while the forming of an undesired deposits 67 can be observed in the lower part of the lower portion 62 of each wire 26. For each wire 26, there is no continuity between the semiconductor layers of semiconductor stack 42 and the deposit 67 simultaneously formed on the lateral walls of wire 26, so that the forming of a short-circuit is prevented.

In FIGS. 6C and 6D, each active area 40 has been shown with a substantially constant cross-section area along axis C. As a variant, the conditions of growth of active area 40 may be selected so that active area 40 has the shape of a truncated pyramid of axis C with a cross-section area which decreases along axis C as the distance to substrate 14 increases. Such a shape may be obtained with no significant loss of the volume of the quantum well or of the quantum wells with respect to the case where the cross-section area is constant. An active area 40 having the shape of a truncated pyramid advantageously enables to increase the thickness of the semiconductor layer 44 covering it and to improve the passivation of the surface of active area 40.

According to another embodiment, the growth of the lower portions 62 of wires 26, and/or of the upper portions 64 of wires 26, and/or of active areas 40 is achieved by another method than a vapor deposition at a pressure lower than 1.33 mPa ($10^{-5}$ Torr), particularly by PA-MBE. The growth method must however allow the forming of the flared upper portion 64 of each wire 26.

According to another embodiment, the growth of the lower portions 62 of wires 26, and/or of the upper portions 64 of wires 26, and/or of active areas 40 is achieved by MOCVD, by MBE, particularly ammonia-enhanced MBE, by atomic layer epitaxy (ALE). As an example, the method may comprise injecting into a reactor a precursor of a group-III element and a precursor of a group-V element. Examples of precursors of group-III elements are trimethylgallium (TMGa), triethylgallium (TEGa), trimethylindium (TMIn), or trimethylaluminum (TMAl). Examples of precursors of group-V elements are ammonia ($NH_3$), tertiary-butylphosphine (TBT), arsine ($AsH_3$), or unsymmetrical dimethylhydrazine (UDMH). Call III/V the ratio of the gas flux of the precursor of the group-III element to the gas flux of the precursor of the group-V element.

Figure 7A:
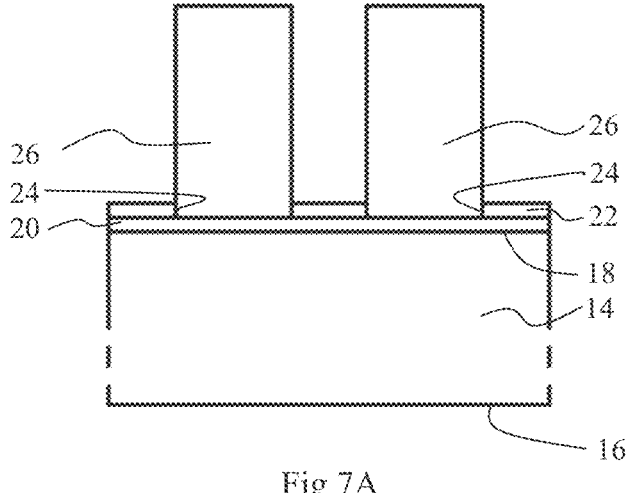
FIGS. 7A to 7C are partial simplified cross-section views of structures obtained at successive steps of another embodiment of a method of manufacturing the optoelectronic device shown in FIG. 1.
Figure 7B:
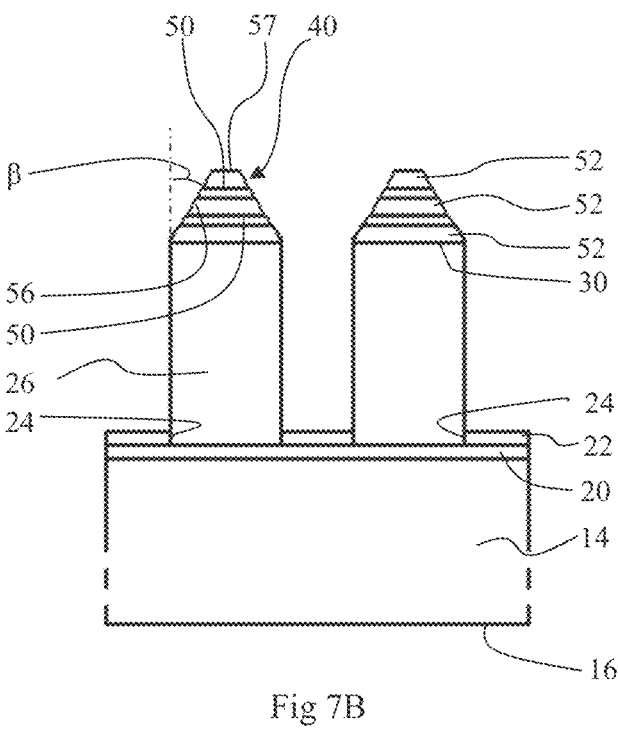
Figure 7C:
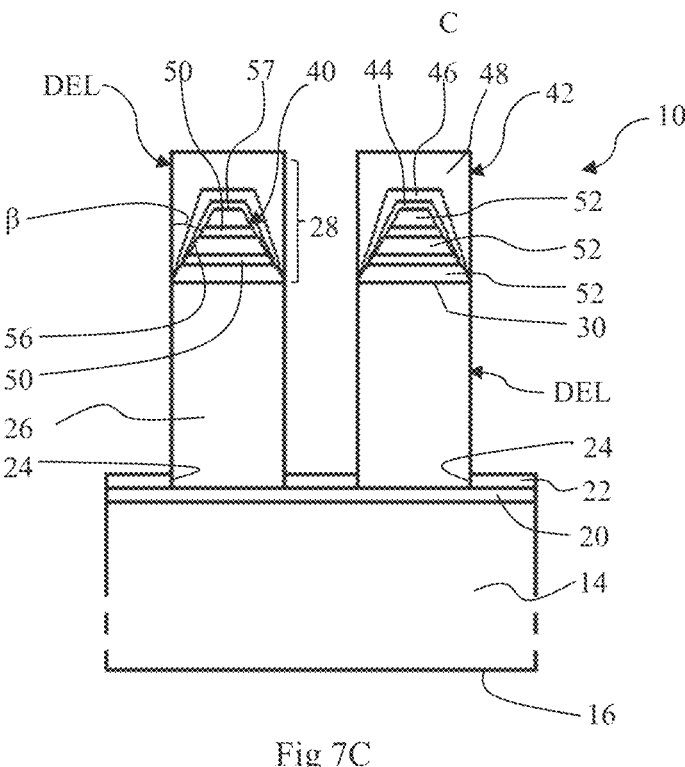

FIGS. 7A to 7C are partial simplified cross-section views of the structure obtained at successive steps of another embodiment of a method of manufacturing the optoelectronic device 10 shown in FIG. 1.

FIG. 7A shows the structure obtained after the steps previously described in relation with FIG. 6A.

According to an embodiment, the growth of wires 26 is achieved by PA-MBE with the polarity of the group-III element. The pressure in the reactor is in the range from $5 \cdot 10^{-4}$ Torr (50 mPa) to $10^{-7}$ Torr (0.0133 mPa). The growth conditions in the reactor are adapted to favoring a preferential growth of each wire 26 along its axis C. Ratio III/V is in the range from 1 to 2, preferably in the range from 1.2 to 1.6. The temperature in the reactor is for example in the range from 600° C. to 900° C., preferably from 750° C. to 850° C.

FIG. 7B shows the structure obtained after the growth of the layers of active areas 40. According to an embodiment, the growth of the layers of active areas 40 is achieved by PA-MBE. The pressure in the reactor is in the range from $5 \cdot 10^{-4}$ Torr (50 mPa) to $10^{-7}$ Torr (0.0133 mPa). The growth conditions in the reactor are adapted to favoring a preferential growth of layers in active area 40 in planar fashion along its axis C. For each quantum well 50, the ratio of the atomic flux of the first group-III element to the atomic flux of the group-V element is in the range from 0.15 to 0.5. The ratio of the atomic flux of the second group-III element to the atomic flux of the group-V element is in the range from 0.5 to 2.85. The ratio of the atomic flux of the first and second group-III elements to the atomic flux of the group-V element, also called m/V ratio, is in the range from 1 to 3, preferably in the range from 1 to 1.8. The temperature of the growth surface in the reactor is for example in the range from 500° C. to 800° C., preferably from 600° C. to 700° C. For each barrier layer 52, the III/V ratio is in the range from 0.01 to 2, preferably in the range from 0.2 to 0.6 to specifically favor the growth of the active area in the form of a pyramid. A limited potential roughness of the barrier layer is here accepted if the residual indium to be incorporated is by a sufficient quantity. The ratio of the atomic flux of the second group-III element to the atomic flux of the group-V element is in the range from 0 to 0.5, preferably equal to approximately 0. The temperature in the reactor is for example in the range from 500° C. to 800° C., preferably from 600° C. to 700° C.

According to an embodiment, the temperature of the growth surface in the reactor for the forming of each quantum well and the temperature of the growth surface in the reactor for the forming of each barrier layer are equal to within 50° C., preferably to within 30° C., more preferably to within 10° C. This enables to avoid phases of temperature change between the forming of a quantum well and of a barrier layer, in particular of temperature rises for the forming of a barrier layer.

FIG. 7 shows the structure obtained after the steps previously described in relation with FIG. 6D.

First, second, and third tests have been carried out, wires 26 were made of n-type doped GaN. The mean diameter of each wire 26 was substantially equal to 200 nm. Each active area 40 comprised ten InGaN quantum wells with non-intentionally doped InGaN barrier layers, the barrier layers having an indium atomic percentage smaller than or equal to that of the quantum wells. The quantum wells and the barrier layers have been formed by PA-MBE. Each semiconductor stack 42 comprised an AlGaN blocking layer 46 and a p-type doped GaN semiconductor layer 44. The AlGaN blocking layers 46 have been formed by PA-MBE with a (Ga+Al)/N ratio of 1. The p-type doped semiconductor GaN layers 44 have been formed by PA-MBE with a Ga/N ratio of 1 and a 850° C. temperature.

For the first test, the InGaN quantum wells have been formed with a (Ga+In)/N ratio of 1.2. For the second test, the InGaN quantum wells have been formed with (Ga+In)/N ratio of 1.6. For the third test, the InGaN quantum wells have been formed with a (Ga+In)/N ratio of 2.

Figure 9:
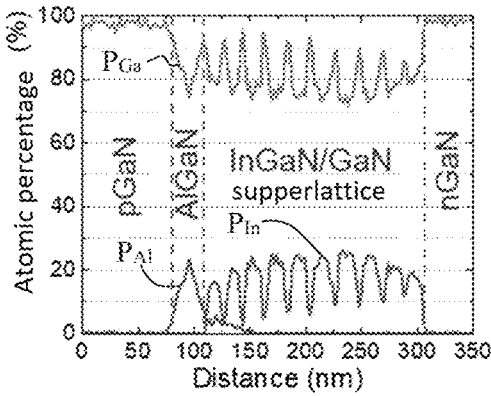
Figure 10:
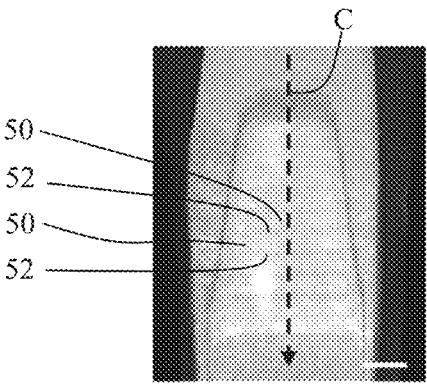
FIGS. 10 and 11 are figures similar respectively to FIGS. 8 and 9 for second manufacturing conditions.
Figure 11:
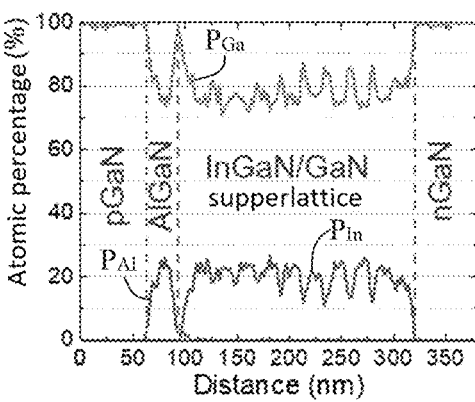
Figure 12:
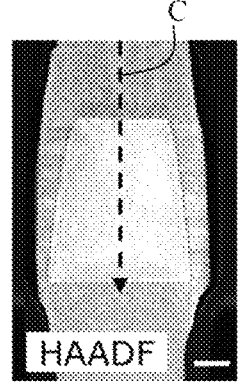
FIGS. 12 and 13 are figures similar respectively to FIGS. 8 and 9 for third manufacturing conditions.
Figure 13:
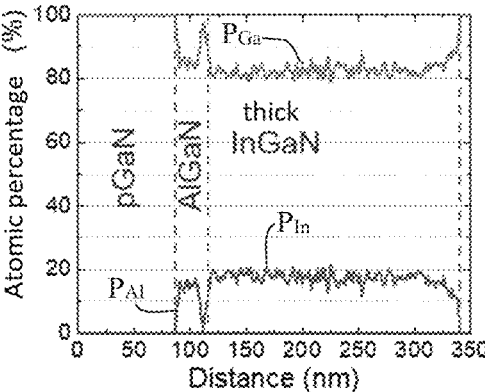

FIGS. 8, 10, and 12 are images obtained by scanning transmission electron microscopy, of the upper end of wires 26, of active areas 40, and of the semiconductor stacks, respectively for the first, second, and third tests. FIGS. 9, 11, and 13 each show profiles $P_{Ga}$, $P_{In}$, and $P_{Al}$ of the atomic percentages along axis C of wire 26 respectively made of gallium, indium, and aluminum obtained by energy dispersive X-ray (EDX) spectroscopy, FIGS. 9, 11, and 13 being respectively obtained for the first, second, and third tests.

As shown in these drawings, the indium concentration in quantum wells 50 is substantially the same for the three tests. The indium concentration in barrier layers 52 varies according to the tests. For the first test, the presence of indium in the barrier layers can be observed, with however a clear difference in indium concentrations between quantum wells 50 and barrier layers 52. Conversely, when ratio (Ga+In)/N is greater than 2, quantum wells 50 can no longer be distinguished from barrier layers 52.

Figure 14:
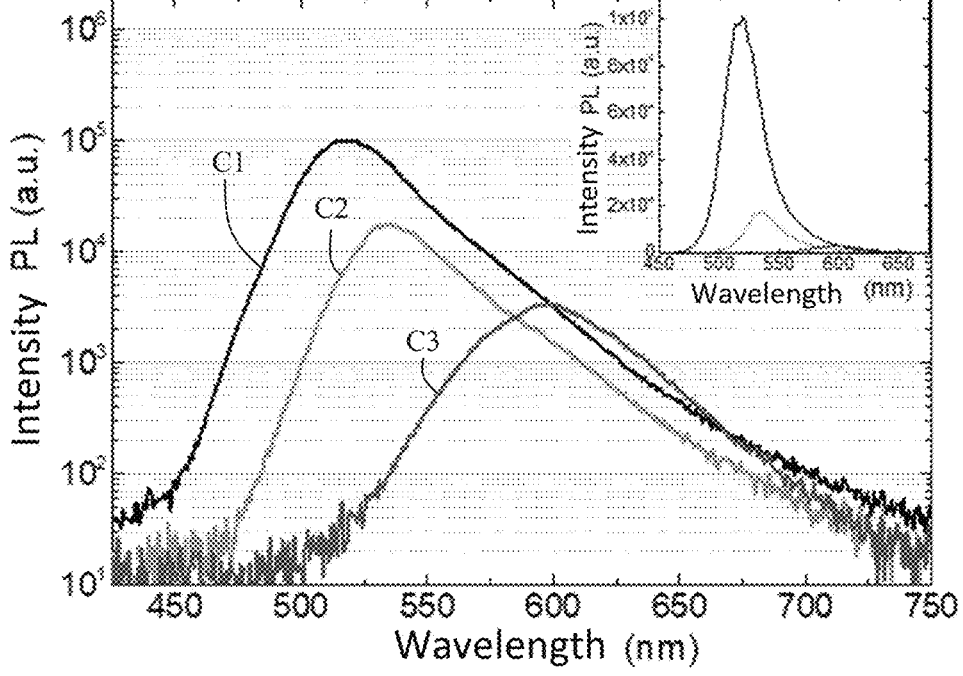
FIG. 14 shows curves of the variation of the light intensity of the device of FIG. 1 for the three manufacturing conditions.

FIG. 14 shows curves of the variation C1, C2, and C3, of the light intensity PL (expressed in arbitrary unit) according to the wavelength respectively for the first, second, and third test. As shown in the tests, the maximum light intensity is obtained for the first test.

Various embodiments and variants have been described. Those skilled in the art will understand that certain features of these various embodiments and variants may be combined, and other variants will occur to those skilled in the art. Finally, the practical implementation of the described embodiments and variants is within the abilities of those skilled in the art based on the functional indications given hereabove.

The invention claimed is:

1. Method of manufacturing an optoelectronic device comprising light-emitting diodes comprising three-dimensional semiconductor elements, comprising forming the three-dimensional semiconductor elements, extending along parallel axes, made of a III-V compound, with a polarity of the group-III element of the III-V compound, the method further comprising, for each semiconductor element, forming an active area covering the top of the semiconductor element and a stack of semiconductor layers covering the active area, the active area being formed by vapor deposition at a pressure lower than 66.6 mPa and comprising quantum wells separated by barrier layers, each quantum well comprising a ternary alloy comprising at least one first group-III element, the group-V element of the III-V compound, and a second group-III element, each barrier layer comprising the III-V compound, wherein, for the forming of each quantum well, the ratio of the atomic flux of the first and second group-III elements to the atomic flux of the group-V element is in the range from 1 to 1.8, the ratio of the atomic flux of the first group-III element to the atomic flux of the group-V element varies from 0.01 to 1, and the ratio of the atomic flux of the second group-III element to the atomic flux of the group-V element varies from 0.05 to 5, and wherein, for the forming of each barrier layer, the ratio of the atomic flux of the group-III element of the III-V compound to the atomic flux of the group-V element varies from 0.2 to 0.6.

2. The method according to claim 1, wherein the ratio of the atomic flux of the first and second group-III elements to the atomic flux of the group-V element of the III-V compound is in the range from 1 to 1.4, preferably from 1.1 to 1.3.

3. The method according to claim 1, wherein each quantum well is formed at a first temperature and each barrier layer is formed at a second temperature equal to the first temperature to within 50° C., preferably to within 30° C., more preferably to within 10° C.

4. The method according to claim 1, wherein the quantum wells and the barrier layers are formed by molecular beam epitaxy.

5. The method according to claim 1, wherein the first group-III element is identical to the group-III element of the III-V compound.

6. The method according to claim 1, wherein the three-dimensional semiconductor elements are formed by molecular beam epitaxy.

7. The method according to claim 6, wherein the ratio of the atomic flux of the group-III element of the III-V compound to the atomic flux of the group-V element of the III-V compound, for the forming of the three-dimensional semiconductor elements, is in the range from 0.35 to 2.

8. The method according to claim 1, wherein each active area comprises a base, sides, and a top, the base resting on the three-dimensional semiconductor element, the quantum wells comprising edges exposed on the sides, said stack covering the sides and the top.

9. The method according to claim 8, wherein each active area has the shape of a truncated pyramid of half apical angle β having its base resting on the three-dimensional semiconductor element, angle β being greater than 0°, preferably in the range from 5° to 80°, more preferably in the range from 20° to 30°.

10. The method according to claim 1, wherein at least a portion of each three-dimensional semiconductor element is a microwire, a nanowire, or a micrometer- or nanometer-range frustoconical element.

11. The method according to claim 1, wherein the three-dimensional semiconductor elements are n-type doped.

12. The method according to claim 11, wherein each stack comprises a semiconductor layer made of a p-type doped III-V compound.

13. The method according to claim 1, wherein the active areas are regions having most of the electromagnetic radiation supplied by the light-emitting diodes emitted therefrom.

\*　\*　\*　\*　\*